(12) United States Patent
Miura et al.

(10) Patent No.: US 7,145,236 B2
(45) Date of Patent: *Dec. 5, 2006

(54) SEMICONDUCTOR DEVICE HAVING SOLDER BUMPS RELIABLY REFLOW SOLDERABLE

(75) Inventors: Kazuma Miura, Yokohama (JP); Hanae Shimokawa, Yokohama (JP); Koji Serizawa, Fujisawa (JP); Tasao Soga, Yokohama (JP); Tetsuya Nakatsuka, Yokohama (JP)

(73) Assignee: Renesas Technology Corp., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/265,660

(22) Filed: Oct. 8, 2002

(65) Prior Publication Data
US 2003/0030149 A1 Feb. 13, 2003

Related U.S. Application Data

(63) Continuation of application No. 09/811,445, filed on Mar. 20, 2001, now Pat. No. 6,486,411.

(30) Foreign Application Priority Data

Jun. 12, 2000 (JP) .............................. 2000-180712

(51) Int. Cl.
*H01L 23/48* (2006.01)
*H01L 21/48* (2006.01)

(52) U.S. Cl. ...................... 257/738; 257/772; 257/779; 257/780; 438/108; 438/613

(58) Field of Classification Search ................ 228/179, 228/180.21, 180.22; 257/738, 778, 779–781; 438/108, 612, 613
See application file for complete search history.

(56) References Cited

U.S. PATENT DOCUMENTS

| | | | |
|---|---|---|---|
| 4,825,284 A | 4/1989 | Soga et al. | 357/80 |
| 4,970,577 A | 11/1990 | Ogihara et al. | 357/74 |
| 5,405,577 A * | 4/1995 | Seelig et al. | 420/561 |
| 5,849,606 A * | 12/1998 | Kikuchi et al. | 438/108 |
| 5,874,043 A * | 2/1999 | Sarkhel et al. | 420/557 |
| 5,942,185 A | 8/1999 | Nakatsuka et al. | 420/562 |
| 5,985,212 A * | 11/1999 | Hwang et al. | 420/560 |
| 5,998,861 A | 12/1999 | Hiruta | 257/700 |
| 6,104,093 A | 8/2000 | Caletka et al. | 257/778 |
| 6,160,308 A * | 12/2000 | Aoki | 257/678 |
| 6,224,690 B1 | 5/2001 | Andricacos et al. | 148/400 |
| 6,228,680 B1 * | 5/2001 | Thomas | 438/108 |
| 6,257,215 B1 | 7/2001 | Kaminaga et al. | 123/647 |
| 6,337,445 B1 * | 1/2002 | Abbott et al. | 174/260 |
| 6,486,411 B1 * | 11/2002 | Miura et al. | 174/256 |
| 2002/0089836 A1 * | 7/2002 | Ishida et al. | 361/824 |

FOREIGN PATENT DOCUMENTS

JP 63289947 A * 11/1988

(Continued)

*Primary Examiner*—Alonzo Chambliss
(74) *Attorney, Agent, or Firm*—Antonelli, Terry, Stout and Kraus, LLP.

(57) ABSTRACT

A semiconductor module solder bonding of high reliability in which the heat resisting properties of the circuit substrate and electronic parts are taken into consideration. In order to achieve this, there are provided semiconductor devices each having solder bumps as external pads, and a circuit substrate bonded to the external pads of each of the semiconductor devices through a solder paste, each of the solder bumps being made of a first lead-free solder, the solder paste being made of a second lead-free solder having a melting point lower than that of the first lead-free solder.

7 Claims, 7 Drawing Sheets

FOREIGN PATENT DOCUMENTS

| | | | | |
|---|---|---|---|---|
| JP | 10193169 A | * | 7/1998 | |
| JP | 10314980 A | * | 12/1998 | |
| JP | 101014 | | 4/2000 | |
| JP | 2000101014 A | * | 4/2000 | |
| WO | WO9709455 | * | 3/1997 | |

* cited by examiner

FIG.5

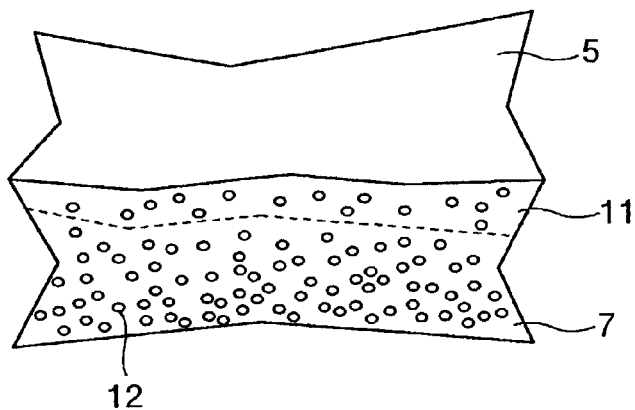

FIG.6

| SOLDER FOR MOUNTING | TEMPERATURE OF REFLOW HEATING (SOLDER BONDING PORTIONS) | NUMBER OF PINS IN WHICH CRACK OCCURRED (PKG SIDE / SUBSTRATE SIDE) | CRACK MORE THAN 300 μm IN LENGTH [NOT LESS THAN (PAD DIAMETER ×1/2)] (PKG SIDE / SUBSTRATE SIDE) | MAXIUM CRACK LENGTH (μm) |
|---|---|---|---|---|
| Sn-3Ag-0.7Cu | 220 | 5 (0/2) | 0 | 60 μm |
|  | 215 | SOLDER FOR MOUNTING WAS NOT MELTED |  |  |
| Sn-38Pb | 200 | 3 (1/2) | 0 | 70 μm |
| Sn-3Ag-5Bi | 215 | 4 (1/3) | 0 | 60 μm |
|  | 210 | 5 (2/3) | 0 | 75 μm |
|  | 205 | SOLDER FOR MOUNTING WAS NOT MELTED |  |  |
| Sn-3Ag-2Bi-3In | 215 | 5 (1/4) | 0 | 70 μm |
|  | 210 | 6 (2/4) | 0 | 85 μm |
|  | 205 | SOLDER FOR MOUNTING WAS NOT MELTED |  |  |
| Sn-1Ag-57Bi | 180 | 12 (0/12) | 0 | 250 μm |
| Sn-8Zn-3Bi | 205 | 6 (2/4) | 0 | 80 μm |
| Sn-9Zn | 205 | 5 (2/3) | 0 | 90 μm |
| Sn-2.8Ag-15Bi | 200 | 10 (2/8) | 2 (0/2) | 350 μm |

SEMICONDUCTOR DEVICE HAVING SOLDER BUMPS RELIABLY REFLOW SOLDERABLE

RELATED APPLICATION

This application is a Continuation application of application Ser. No. 09/811,445, filed Mar. 20, 2001, now U.S. Pat. No. 6,486,411 issued Nov. 26, 2002, the contents of which are incorporated herein by reference in their entirety.

BACKGROUND OF THE INVENTION

The invention relates to a technique for mounting a semiconductor device.

There is an increasing demand for semiconductor devices such as BGA, CSP, WPP, flip chip and etc. each of which semiconductor devices has bumps as external pads. In the semiconductor device having the bumps as the external pads, the bumps are formed by, for example, the steps of: preparing a pad pattern in which the plating of nickel-gold (Ni/Au) and nickel-palladium-gold (Ni/Pd/Au) is applied on the surface of copper; coating the pad pattern with flux by printing; mounting solder balls on the flux-coated pad pattern; and reflow-heating them so that the bumps may be formed.

Further, the mounting of these semiconductor devices is performed by the steps of: coating a paste material, which comprises solder particles and flux, on a pad pattern formed on a substrate; positioning the bumps of the semiconductor device and the pad pattern of the substrate; loading the positioned bumps on the pad pattern; and soldering them.

Usually, a material used for the bumps or the mounting is so-called Sn—Pb eutectic solder of Sn-38 mass % Pb.

In recent years, it is urged to put Pb-free solder to practical use.

The melting point of the conventional Sn—Pb eutectic solder is 183° C. On the other hand, in a Pb-free solder material such as, for example, An—Ag—Cu solder, the melting point thereof ranges from 216° C. to 227° C., which melting point is higher than that of the conventional Sn—Pb eutectic solder.

According to the research performed by the inventors of the invention, it is found that, in a case where a semiconductor device such as BGA which device has bumps is mounted on a substrate, there occurs such a phenomenon as the solder bumps do not always melt readily. Namely, according to the inventors' research, it is found that a temperature between the semiconductor device and the substrate is lower than the temperature of the substrate or the semiconductor device itself by a value of 15 to 20° C.

Thus, by setting the reflow temperature so that these Pb-free solder bumps may be melted, the temperature of the substrate or the semiconductor device itself becomes higher by the value of 15 to 20° C. than the temperature measured between the semiconductor device and the substrate, that is, it becomes 240 to 260° C., so that there arises a problem of heat resisting property regarding the substrate and other electric parts (such as electrolytic capacitors and etc.) mounted on the substrate.

SUMMARY OF THE INVENTION

The object of the invention is to realize solder bonding of high reliability in which the heat resisting properties of a circuit substrate and electronic parts are taken into consideration.

In the invention, in order to achieve the object, there are provided the semiconductor module and the circuit substrate both recited in the claims.

The inventors of the invention have noted the respects that, in a case of mounting on a substrate the semiconductor device such as BGA etc. which device has solder bumps, solder paste is fed on the substrate and that bonding portions are formed by the fed solder paste and the solder bumps. In prior arts, the solder paste and the solder bumps are formed of the same material, and they are usually melted completely so that the soldering may be achieved. However, in the invention, the solder bumps are not deemed to be a material for soldering but are deemed to be only pads, and the soldering of the pads (the solder bumps) is performed by the solder paste. Further, in the invention, the solder bumps are made of a material having a melting point higher than that of the solder paste so that each of the solder bumps may not be completely melted positively. As stated above, the temperatures of the bumps and the surrounding thereof are apt to become lower than the set reflow temperature, however, the solder paste is readily melted in comparison with the bumps, so that it is easy to perform the soldering.

Thus, even at a reflow temperature at which each of the solder bumps is not melted completely, it becomes possible to realize, while taking the heat resistance of the circuit substrate and electric parts into consideration, soldering of high reliability in a case where bonding portions can be formed by the melting of the solder paste. For example, in a case where a semiconductor device having bumps as the outer pads thereof is mounted on a substrate by use of solder paste for mounting, the solder bumps are made of a material such as Sn—Cu alloy or Sn—Ag—Cu alloy which material has a melting point higher than that of conventional solder containing Pb, the solder for mounting the substrate being made to have a composition of a melting point lower than that of the solder bumps, and the reflow thereof is performed at such a temperature as the heat resisting properties of the substrate and the electric parts are taken into consideration, so that a mixture layer is formed between each of the solder bumps and the solder paste for mounting although each of the solder bumps is not melted completely with some of the original shape of each bump remaining, whereby it becomes possible to perform the bonding of both of the semiconductor device and the circuit substrate with high reliability. In this case, in order to prevent unexpected intermediate products from occurring during the forming of the mixture layer, it is preferred that the solder bumps have a solder composition of the same kind as that of the solder for mounting.

Further, in a case of using the solder of the Sn—Ag—Cu alloy, there occur such problems as acicular crystals occur and as migration and short are caused due to the acicular crystals. Thus, it is desired to reduce the content of Ag contained in soldering portions formed between the semiconductor device and the circuit substrate. However, in the invention, the solder for mounting needs to have such a composition as to be melted at the reflow temperature, so that the composition of the solder is decided by the reflow temperature, that is, there is a limit regarding the reducing of the Ag content of the solder for mounting. Thus, it is preferred that, by reducing the amount of Ag inflowing from the solder bumps into the solder for mounting, the content of Ag contained in the soldering portions is prevented from increasing. Namely, it is preferred that the content of Ag contained in the solder bumps is less than that of the solder for mounting. For example, the solder balls (,i.e., solder bumps) may be made of Sn—Cu alloy solder. As regards the solder for mounting, the composition thereof is decided in accordance with the reflow temperature, and a Sn— about 2.0 to about 3.5 mass % Ag— about 0.3 to about 0.8 mass % Cu alloy is preferred in view of the reliability of bonding. In this specific case, it becomes preferred that the solder balls have the composition of Sn— zero to about 2.0 mass % Ag— about 0.3 to about 0.8 mass % Cu.

BRIEF DESCRIPTION OF THE DRAWINGS

FIG. 5 is a drawing for explaining a method of distinguishing the mixture layer from the layer of the solder for mounting.

FIG. 6 is a table showing the results of evaluation obtained when BGAs each having bumps of Sn-3.5Ag-0.75Cu alloy solder are mounted by use of various solder pastes for mounting disclosed in the table.

DETAILED DESCRIPTION OF THE PREFERRED EMBODIMENTS

Figure 1:
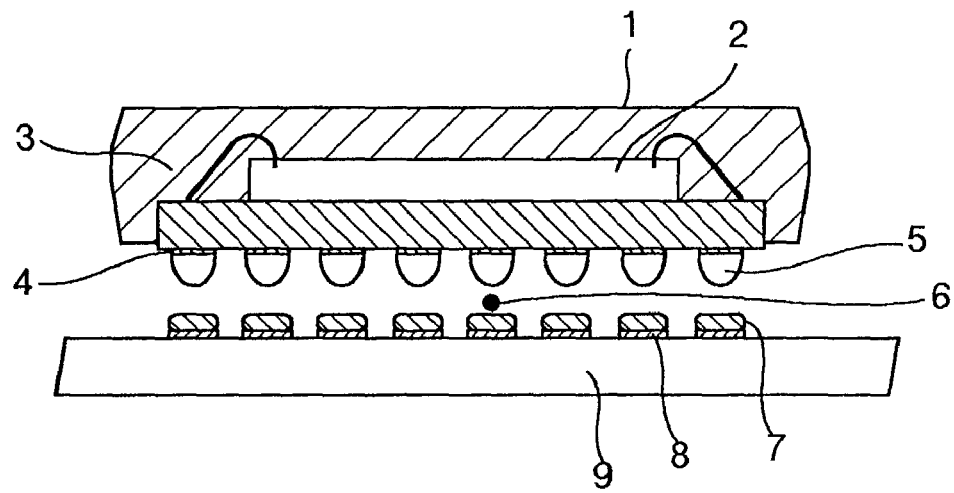
FIG. 1 is a schematic view of an example of BGA used in an embodiment of the invention.

The preferred embodiments of the invention are described below while referring to the drawings.

FIG. 1 a schematic view of an example of BGA used in the embodiment of the invention. The dimensions of a package used therein is 30 mm×30 mm, and a chip 2 located in the package has dimensions of 10 mm×10 mm. Each of solder bumps 5 has a diameter of 0.76 mm. Each of pads 4 formed on a BGA substrate 3 has a diameter of 0.6 mm, which pads are made of copper metallized with the plating layer of Ni (of a thickness of 10 to 25 μm)/Au (of a thickness of 0.5 to 1.2 μm). The mounting substrate 9 is FR-4 substrate having a thickness of 1 mm. Each of pads 8 provided on the substrate 9 has a diameter of 0.6 mm, each of the pads 8 being formed of copper metallized with the layer of Ni (of a thickness of 2 μm)/Au (of a thickness of 0.03 μm). The mounting thereof is performed by the steps of: transferring on the pads 8 a solder paste 7 through a printing mask which solder paste contains solder particles and flux; performing the positioning of the bumps 5 and the pads 8 of the substrate 9; locating the BGA on the substrate 9; and performing the reflow heating thereof.

Reflow heating at the time of the mounting may be performed in an air atmosphere, however, in the embodiment of the invention the reflow heating was performed in a nitrogen atmosphere. The temperature of this reflow heating was the temperature of a soldering portion which temperature was actually measured by inserting a thermocouple 6 between one of the solder bumps 5 and one of the pads 7 located on the mounting substrate.

In such a case of the invention as the material of the solder bumps 5 is made to be different from that of the solder 7 for mounting (, that is, as the melting point of the solder for mounting is lower than that of the solder bumps 5), the shape and composition of final bonding portions vary in dependence on the combination of the materials of both of them, the volume ratio thereof, and the temperature of the reflow heating.

Figure 2:
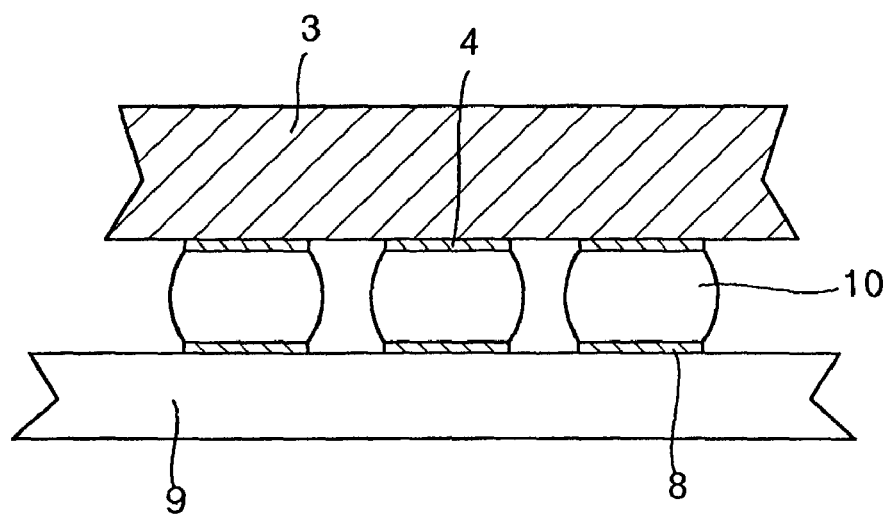
FIG. 2 is a schematic view of the BGA to which a substrate is mounted.

First, in a case where the temperature of the reflow heating is made to be not less than the melting point of the solder bumps 5, each of the solder bumps 5 and the mounting solder 7 corresponding to each of the solder bumps 5 are completely dissolved in each other, so that each of the bumps 10 comes to have a shape shown in FIG. 2 each of which bumps 10 has an even composition. In a case where the substrate and other electronic parts have sufficient heat resisting properties, the temperature of the reflow heating may be set so that the temperature between one of the solder bumps 5 and corresponding one of the pads 7 formed on the mounting substrate may become not less than the melting point of the solder bumps 5, as in the case described above. In this case, the soldering portions have the substantially same bonding structure as conventional bonding structure, and the reliability of bonding can be also obtained without any problem.

Figure 3:
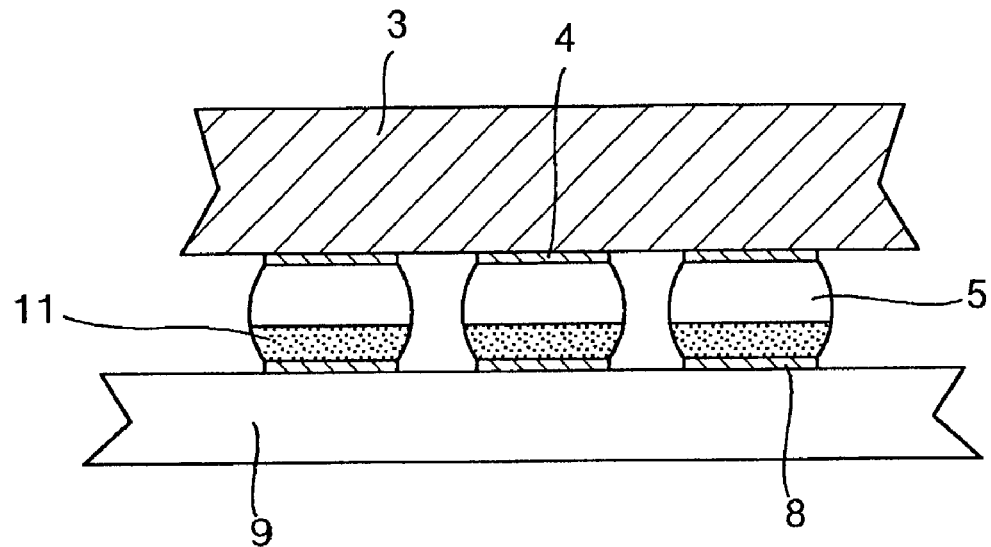
FIG. 3 is a drawing showing a state in which the structure of the bumps is formed, after the completion of the mounting, of two phases, that is, the structure of the solder bumps 5 and the structure of a mixture layer 11 of both of the solder bumps and the solder for mounting.
Figure 4:
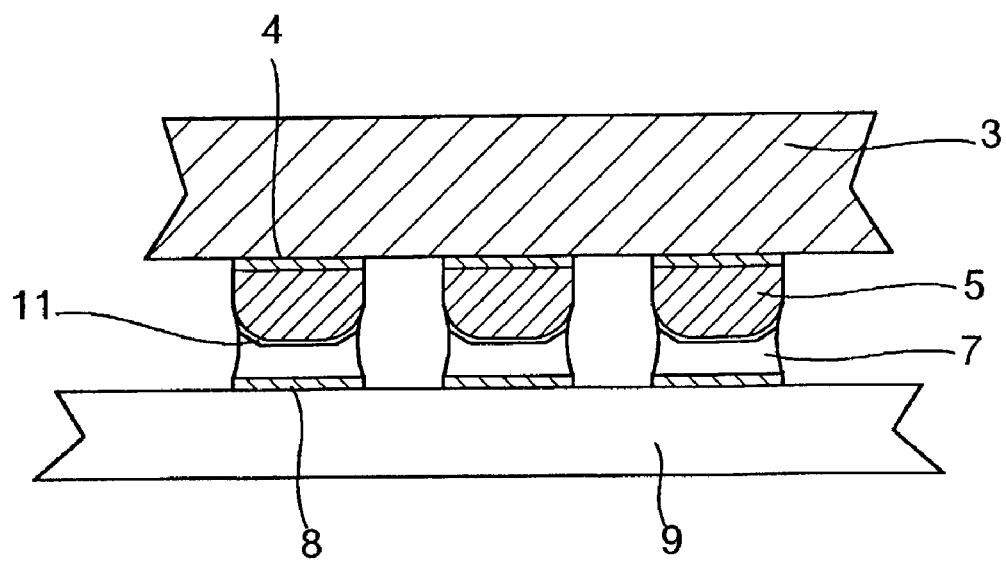
FIG. 4 is a drawing showing another state in which the mixture layer 11 formed on the solder bumps 5 is thin in thickness with the result that fillets made of the solder for mounting are formed.

Next, there is described below another case where the reflow heating is performed at a temperature between the melting point of the solder bumps 5 and the melting point of the solder 7 for mounting. In this case, the bump shape after the mounting (, that is, final bonding structure) varies in dependence on the temperature of the reflow heating. For example, as shown in FIG. 3, although the bump shape after the mounting is the same as that of FIG. 2, the composition thereof is not even, that is, in each of the resultant bumps there are formed, as shown in FIG. 3, two layers of the original structure of the bumps 5 having been formed on the BGA substrate 3 and a mixture layer 11 of a mixture formed by the diffusion between the composition of the bumps 5 and the composition of the mounting solder 7. Or, in each of the resultant bumps, as shown in FIG. 4, the mixture layer is thin in thickness, and fillet is formed on the side of the mounting substrate which fillet is made of the solder 7 for mounting. As regards the distinction between the mixture layer 11 and the solder 7 for mounting both shown in FIG. 4, it is possible to distinguish them from each other by the distribution of added elements contained in the solder 7 for mounting. For example, in a case where there exists a region 11 in which the rate of the added elements 12 is low as shown in FIG. 5, this region 11 is judged to be the mixture layer of both of the bumps 5 and the solder 7 for mounting. On the other hand, in another case where there exists a region the composition of which is the substantially same as that of the solder 7, this region is judged to be the solder for mounting. Further, it goes without saying that the shape and structure of the bumps formed after the mounting vary in dependence on difference in melting point between the material of the solder bumps and the solder for mounting, the wettability thereof and the volume ratio thereof as well as the temperature of the reflow heating performed during the mounting.

Figure 7:
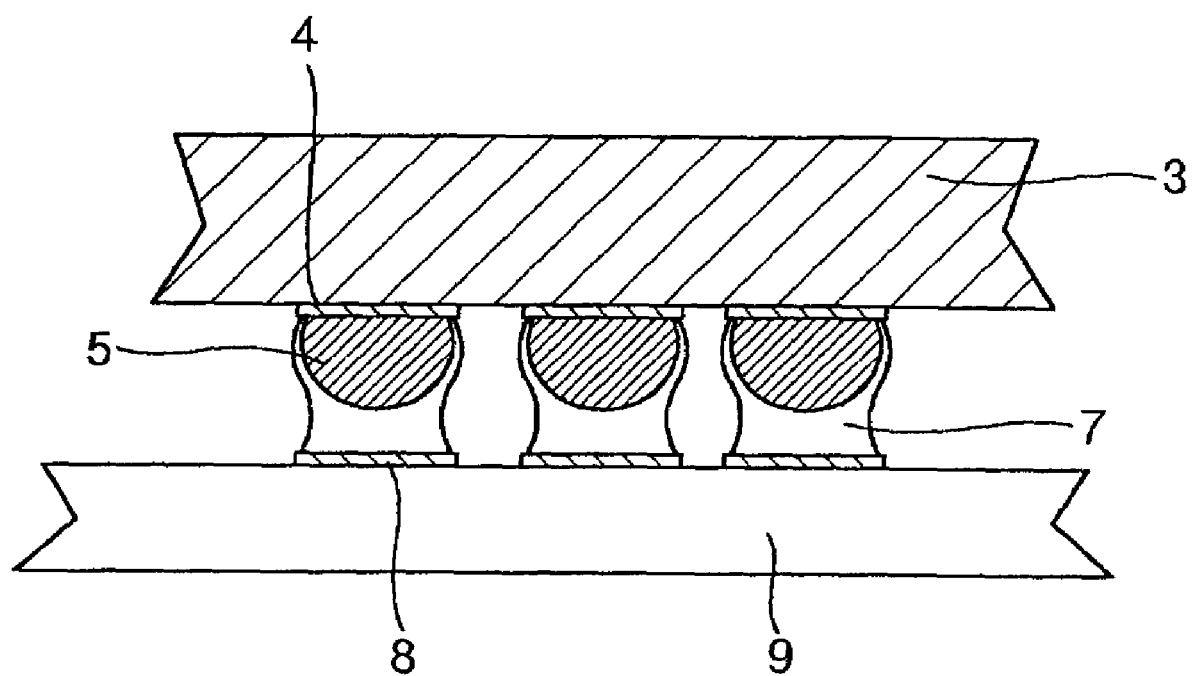
FIG. 7 is a drawing showing a still another state in which the side portion of each of the bumps is surrounded by a part of the solder for mounting.

In a case where the ratio of the solder for mounting becomes high, both of the mixture layer 11 and the solder 7 for mounting come to be present, as shown in FIG. 7, even on the side portion of each of the bumps 5 for the BGA as well as in the vicinity of the substrate, so that there occurs such a shape as the solder 7 for mounting surrounds the periphery of each of the bumps 5. For example, in a case where the diameters of each of the bumps and each of the pads is 0.3 mm, the diameter of each of openings in a printing mask for applying the solder for mounting being 0.3 mm, the thickness thereof being 0.15 mm, the volumes of each of the bumps 5 and the solder for mounting become 0.014 mm$^3$ and 0.0064 mm$^3$, respectively, the volume ratio of each of the bumps to the solder for mounting becoming about 2:1, and a part of the solder for mounting comes to be present on the side portion of each of the bumps 5 with the result that there occurs a shape similar to the bump structure shown in FIG. 7. As regards this shape, there occurs no problem at all insofar as temperature cycling tests in the range of −55 to 125° C. are concerned. On the contrary, the reliability thereof is improved because of increase in bonding area between each of the bumps 5 and the solder 7 for mounting.

Thus, in a case of the bonding structure shown in each of FIGS. 3, 4, 5 and 7 in which the melting point of the solder paste 7 for mounting is lower than that of the bumps 5 and in which the reflow heating is performed to obtain this bonding structure at a temperature between the melting point of the solder bumps 5 and the melting point of the solder 7 for mounting, the solder bumps are not melted completely with some of each of the solder bumps remaining without melting, and it becomes possible, because of the occurrence of the mixture layer, to perform the bonding of high reliability between the semiconductor device and the circuit substrate. Accordingly, in comparison with the conventional method in which the solder bumps are completely melted, it becomes possible to perform the reflow while taking the heat resisting properties of the substrate and the electronic parts etc. into consideration.

Namely, in taking the bonding structure shown in FIG. 2 into consideration, it becomes possible to perform, by setting the reflow temperature to be a temperature at which at least the solder paste for mounting is melted, the bonding of high reliability between the semiconductor device and the substrate through any one of the bonding structures of FIGS. 2, 3, 4, 5 and 7. In the prior arts, since the bonding is performed by completely melting the solder bumps and solder paste, there occur problems regarding the heat resisting properties of the substrate and electronic parts when the semiconductor device having the solder bumps is mounted. However, in the present invention, the solder bumps are not necessarily melted, so that the solving of the problems becomes easy.

On the other hand, in a case of performing the bonding by mainly melting the solder for mounting, it become also possible to obtain repairable structure by using Sn-1Ag-57Bi solder (, in which the unit of each of the numerical values is mass percent, and this is also applied to all of the compositions described below,) of a low melting point (137° C.) as the solder for mounting. Namely, by feeding lead-free solder of a low melting point to a part of the circuit substrate onto which a semiconductor device such as BGA is to be mounted and by feeding usual lead-free solder of a high melting point to circuit substrate regions other than the former part, it becomes possible to detach an electronic part having the bump structure by heating the bump bonding portions of the semiconductor device up to a temperature not less than 137° C., whereby the repairing can be performed at a relatively low temperature. In a case where the repairing needs to be performed, it is preferred to set the temperature of the reflow heating to be about 160° C. to thereby form the fillet of solder having a low melting point. As regards the composition for the solder for mounting, it is not limited to the Sn-1Ag-57Bi, but any solder composition having a melting point lower than that of the bumps may be used. As a matter of course, the lower the melting point of the solder for mounting is, the lower the temperature of the repairing becomes, however, it goes without saying that the solder for mounting must have such a melting point as not to melt during usual operation.

Next, the reliability of the bonding structure is described below which bonding structure is obtained by the steps of using solder paste 7 for mounting which has a melting point lower than that of solder bumps 5, and performing reflow heating at a temperature between the melting point of the solder bumps 5 and the melting point of the solder 7 for mounting.

In FIG. 6 there are shown evaluation results obtained in temperature cycling tests performed, by using various solder pastes for mounting, each solder paste having a melting point lower than that of solder bumps. The temperature cycling tests were conducted in a temperature range of −55 to 125° C. by 1000 cycles after performing the mounting while using Sn—Ag—Cu (Sn-3.5Ag-0.75Cu) alloy as the material of the solder bumps.

In the samples used in the experiments, when the diameter of each of the bumps (ball diameter of 0.76 mm) and the diameter of each of the pads were 0.60 mm, the volumes of each of the solder bumps and of the solder for mounting (, the diameter of each of openings in a printing mask being 0.76 mm, the thickness thereof being 0.1 mm, and the flux component of the solder for mounting being assumed to be 10%,) was 0.23 mm$^3$ and 0.04 mm$^3$, respectively, and the volume ratio of each of the bumps and the solder for mounting was about 6:1. In general, this volume ratio varies in dependence on the diameter of the bumps, the diameter of the pads, and the opening diameter and thickness of the printing mask, and the smaller the diameters of the bumps and the pads are (, that is, the smaller the pitch thereof becomes), the higher the ratio of the solder for mounting becomes.

In the cases where Sn-3Ag-5Bi and Sn-1Ag-57Bi were used as the solder 7 for mounting, the bump structure shown in FIG. 3 was obtained. However, by making the temperature of the reflow heating more approach to the melting point of the solder 7 for mounting, the shape of each of the bumps changes into one shown in FIG. 4. For example, in a case where the Sn-1Ag-57Bi used as the solder 7 for mounting was heated at 165° C. during the reflow heating, a part of the solder was diffused into each of the solder bumps with the result that the mixture layer 11 was formed, however, most of the solder for mounting came to form the fillet of the Sn-1Ag-57Bi on each of the pads formed on the mounting substrate. In another case where the temperature of the reflow heating was lowered down to 150° C. approaching the melting point of the Sn-1Ag-57Bi solder, such fillets as shown in FIG. 4 were formed although no diffusion layer 11 was observed. Even in such a case as no diffusion phase is formed, there occurs no problem regarding the reliability of bonding, however, since the temperature of the reflow heating approaches the melting point of the solder for mounting, there occurs such a phenomenon as the solder 7 for mounting does not melt regarding pads of relatively low temperature in a case where the variation of temperature in a package is large, and it is necessary to give care to this phenomenon.

The melting point of the Sn-1Ag-57Bi solder is 137° C. Thus, in a case of performing the temperature cycling tests in a temperature range of −55 to 125° C. regarding a mounted body having bump structure provided with the fillets, the fillet portions come to be softened. In the temperature cycles of 0 to 90° C., no occurrence of any crack was observed even after the 1000 cycles. By forming the fillet portions of the above-described solder composition, the fillet portions are melted at a temperature not less than 137° C., whereby electronic parts having the above-described bump structure can be detached by heating the bump bonding portions by heating them up to a temperature not less than 137° C., so that the repair can be performed at a relatively low temperature. Thus, when it is necessary to perform the repair, it is necessary to set the temperature of the reflow heating to be about 160° C. so that fillets of solder of low melting point may be formed.

Accordingly, even in each of the cases where the reflow is performed at a temperature less than the melting point of the solder bumps, it becomes possible to keep the reliability of bonding.

As described above, in the case where the semiconductor device having the Pb-free bumps of the high melting point is mounted to the substrate, it becomes possible to obtain the semiconductor device having the bump structure containing no Pb which semiconductor device also has the same level of reliability as that of conventional semiconductor devices.

Next, there are described below examples in each of which this basic structure is applied to a multi-chip module (semiconductor module).

In compliance with the requirements of the high integration design of a semiconductor, the small size design of the semiconductor device, and the mounting of high density, there is developed a multi-chip module (MCM) on which various semiconductors such as a memory, ASIC, and CPU are mounted or a multi-chip package in which these various semiconductors are packaged. One example thereof is shown in FIG. 8, in which the soldering structure described above is used in a multi-chip module.

Figure 8:
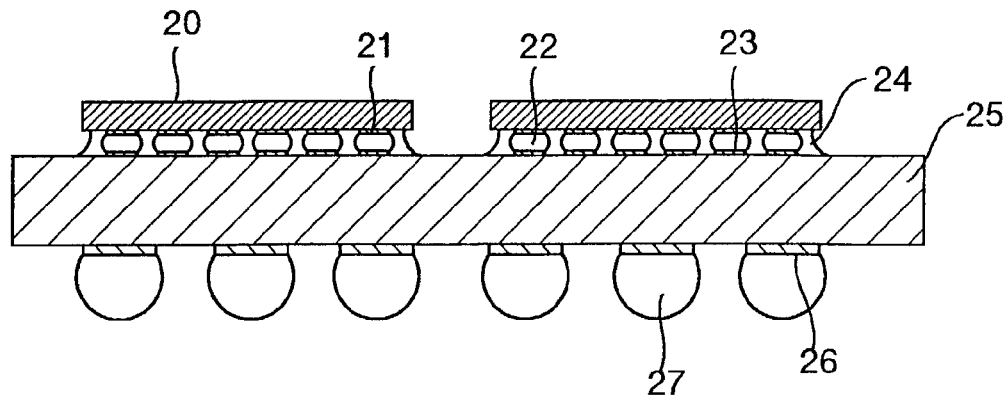
FIG. 8 is a drawing showing an example of multi-chip module (MCM).

In FIG. 8, there are mounted on an intermediate substrate 25 a plurality of packages called WPP (Wafer Process Package) or wafer level CSP in each of which packages routing is provided on a silicon chip 20 and in each of which packages solder bumps 22 are formed on pads 21 provided on the chip 20. The diameter of each of the bumps 27 formed on the intermediate substrate 25 is 0.76 mm, the pitch thereof being 1.27 mm, the diameter of each of the bumps 22 of the WPP located above the intermediate substrate being 0.3 mm, and the pitch thereof is 0.5 mm. In the WPP located above the intermediate substrate 25, an underfill 24 is formed at the bonding portions of the bumps after mounting the WPP. The electrodes 23 and 26 are formed on each side of the intermediate substrate 25. In the multi-chip module, the bumps 22 become external pads of the semiconductor device, the bumps 27 becoming external connection terminals, which is also applied to embodiments described below.

Figure 9:
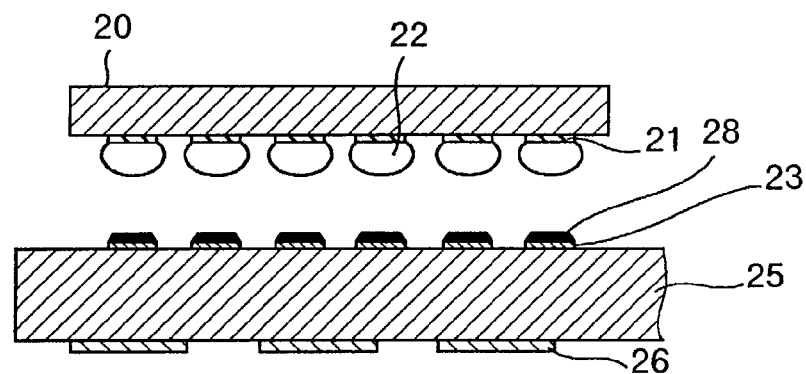
FIG. 9 is a schematic view showing a state before mounting where the solder 22 of a wafer process package (WPP) is different from the mounting solder 28 of a BGA substrate.

In FIG. 9 is schematically shown the mounting of the WPP onto the intermediate substrate. In this case, solder paste 28 was printed on the intermediate substrate 25, both of the intermediate substrate 25 and the WPP being then positioned and being made to be abutted on each other, and the reflow heating thereof was performed to bond them to each other. The solder 22 used regarding the WPP was made of a Sn-0.75Cu alloy, and the solder paste 28 printed on the intermediate substrate was made of a Sn-3Ag-0.50u alloy. Namely, these alloy compositions are selected so that the melting point of the solder 22 may become higher than that of the solder paste 28. The bumps 27 provided on the intermediate substrate 25 were made of the same Sn-3Ag-0.5Cu alloy as that of the solder paste 28 used for mounting the WPP.

Figure 10:
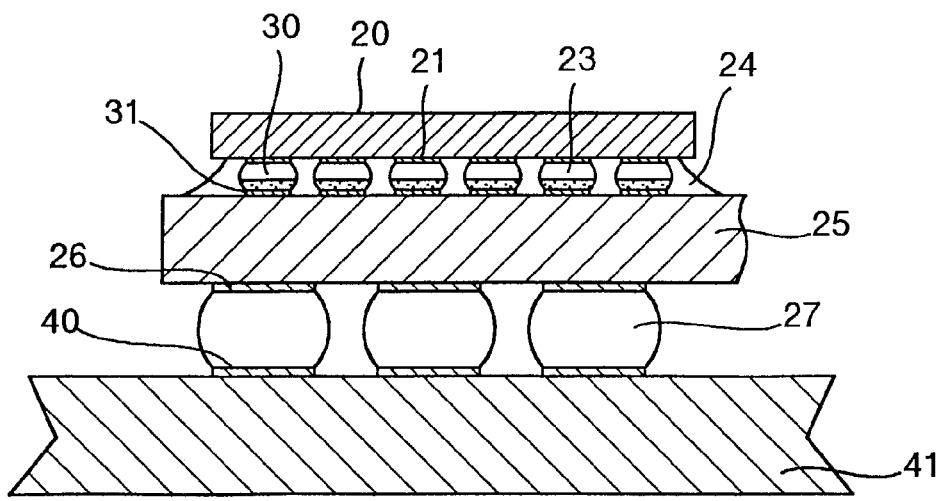
FIG. 10 is a schematic view showing a state after mounting where the solder 22 of the WPP is different from the mounting solder 28 of the BGA substrate.

FIG. 10 is a sectional view of this multi-chip module bonded to a mounting substrate, in which multi-chip module each of the bump portions of the WPP, which bump portions were formed at the side of the intermediate substrate 25 after the mounting of the WPP, does not have even composition but has a portion 30 of the original solder composition and a mixture layer 31 formed of the mixture of the Sn-0.75Cu (which is the composition of the WPP bumps) and the Sn-3Ag-0.5Cu (which is the composition of the solder for mounting).

In general, in the solder of Sn—Ag—Cu alloy, there is such a case as metallic acicular crystals called whiskers occur and reach adjacent bumps when the content of Ag contained in the solder is not less than 3 mass % with the result that short circuit fault is caused. Thus, in the embodiment of the invention, in order to prevent the short circuit from occurring due to the whiskers, the solder of the Sn—Cu alloy containing no Ag was used regarding the bumps formed on the WPP. Incidentally, the bumps 27 are made of the Sn-3Ag-0.5Cu solder, however, the content of Ag contained in the mixture layer formed in each of the resultant bumps provided after the reflow heating becomes less than 3 mass %, so that there occurs no problem that the whiskers are caused. As regards the composition of the solder used for the WPP bumps, no problem occurs even in a case where Sn-1Ag-0.5Cu containing 1 mass % Ag is used. In this case, the difference in melting point between the above Sn—Cu alloy and this Sn-1Ag-0.5Cu is only 1° C. Since, in the semiconductor devices mounted on the intermediate substrate 25, there is used a narrower pitch design than that of the multi-chip module mounted on the mounting substrate 41 on which electrodes 40 are formed, the using of the solder, in which the content of Ag is reduced, at the time of performing the mounting on the intermediate substrate 25 is preferred in view of preventing the short from occurring between the terminals due to the occurrence of the whiskers.

In a case where the intermediate substrate 25 has sufficiently high heat resisting property, it is possible to use a solder containing Ag of a low content regarding the bumps of the WPP and BGA and regarding the solder paste 28 while using regarding the mounting substrate another solder of so-called standard composition lower in melting point than that of the former solder. As a matter of course, it goes without saying that, in the mounting of the multi-chip module onto the mounting substrate 41, the above described structure of the invention can be applied.

Next, there is described below an example in which the above described soldering structure is used when mounting a multi-chip module onto a circuit substrate.

Figure 11:
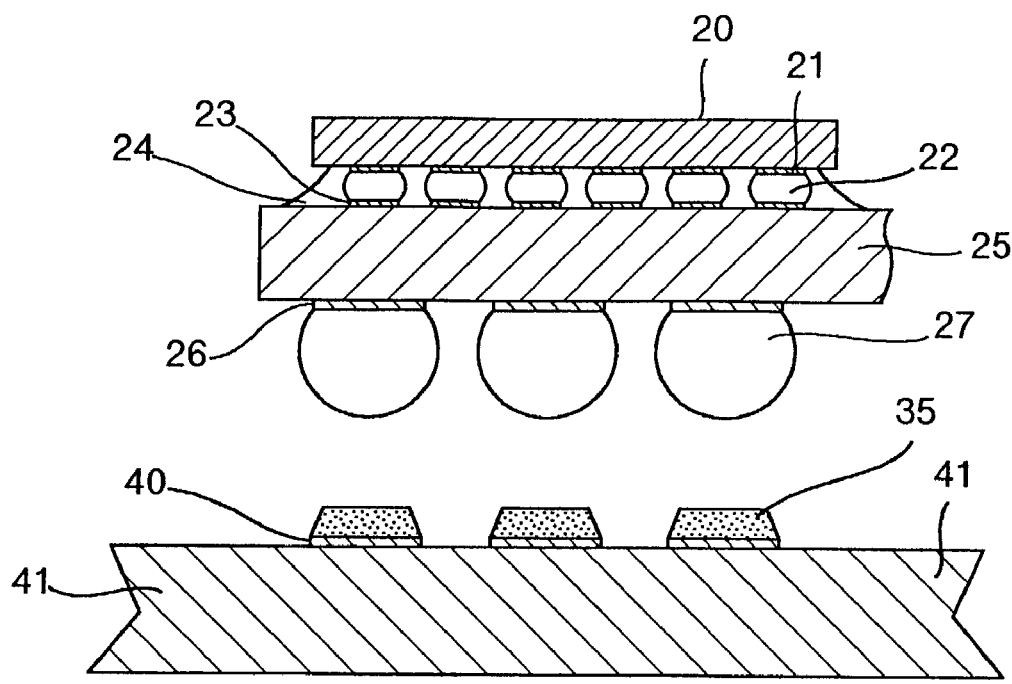
FIG. 11 is a schematic view showing a case of performing mounting on a substrate by use of solder 35 having a melting point lower than those of the bumps 22 of WPP and the bumps 27 of BGA.
Figure 12:
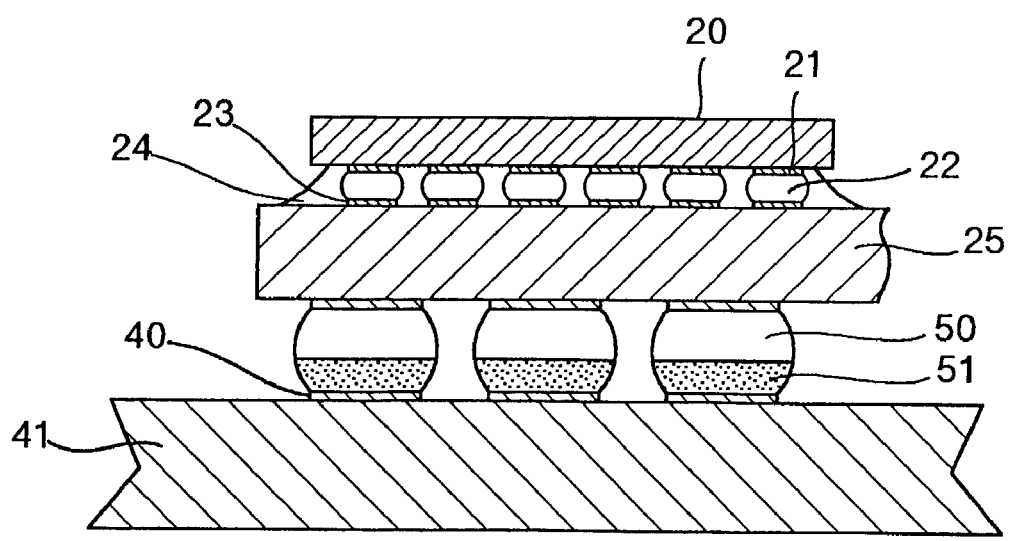
FIG. 12 is a schematic view showing a state where the mounting of the substrate shown in FIG. 11 is finished.

FIG. 11 schematically shows a state just before mounting a multi-chip module with bumps 27 onto a substrate 41 by use of solder 35 (such as, for example, Sn-3Ag-0.5Cu solder) of a melting point lower than that of the bumps 27 while using Sn-0.75Cu alloy or Sn-1Ag-0.5Cu alloy regarding both of the bumps 22 of a semiconductor device and the bumps 27 of the multi-chip module, and FIG. 12 shows the sectional shape of a connection structure brought about after the mounting onto the substrate. In the connection structure of the multi-chip module after the mounting, there are formed a portion 50 having the same composition as that of the original bumps and a mixture layer 51 made of a mixture of the compositions of the bumps and the solder for mounting.

In the multi-chip module, there is such a case as temperature-hierarchical bonding which is required between the solder bonding of a semiconductor device to be mounted on an intermediate substrate and the external connection terminals (i.e., solder balls) of the multi-chip module. This is performed to keep the bonding of high reliability without causing, when soldering the multi-chip module to a circuit substrate, the re-melting of solder bonding already formed in the multi-chip module between the semiconductor device and the intermediate substrate.

According to the above structure embodying the invention, it is possible to select, regarding the bumps 22 of the semiconductor device and the bumps 27 of the multi-chip module, such compositions as not to substantially melt at a reflow temperature at which the solder 35 for mounting is melted for bonding, whereby it becomes possible to realize the bonding of high reliability in the multi-chip module without performing the temperature-hierarchical bonding. In this case, by the melting of the solder 35, a part of each of the bumps 27 of the multi-chip module comes to be melted at the portion in contact with the melted solder 35, so that the mixture layer 51 is formed. As a matter of course, in a case where the re-melting occurring within the multi-chip module needs to be further restrained, the solder used for the bumps 22 of the semiconductor device may be selected to have a composition higher in melting point than that of the solder material used for the bumps 27 of the multi-chip module. In any one of these cases, it is desired that the intermediate substrate has a heat resisting property higher than that of the mounting substrate.

Figure 13:
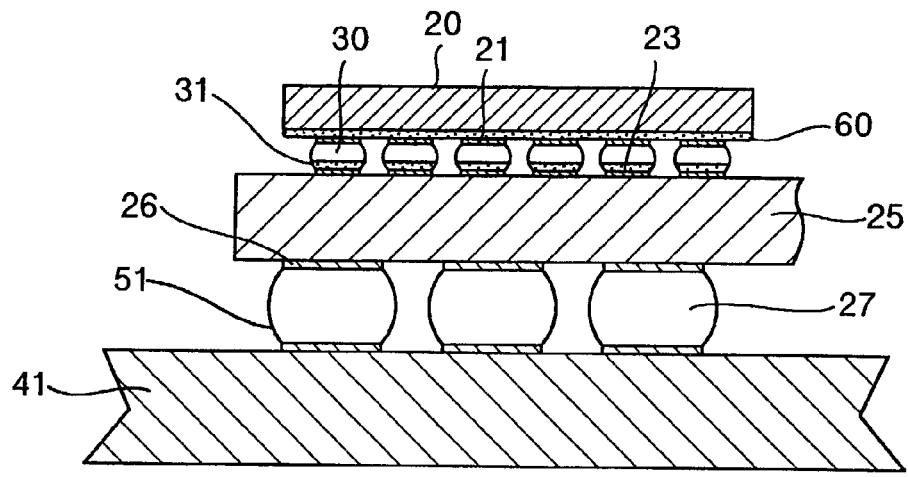
FIG. 13 is a drawing showing WPP having a stress relaxation layer.
Figure 14:
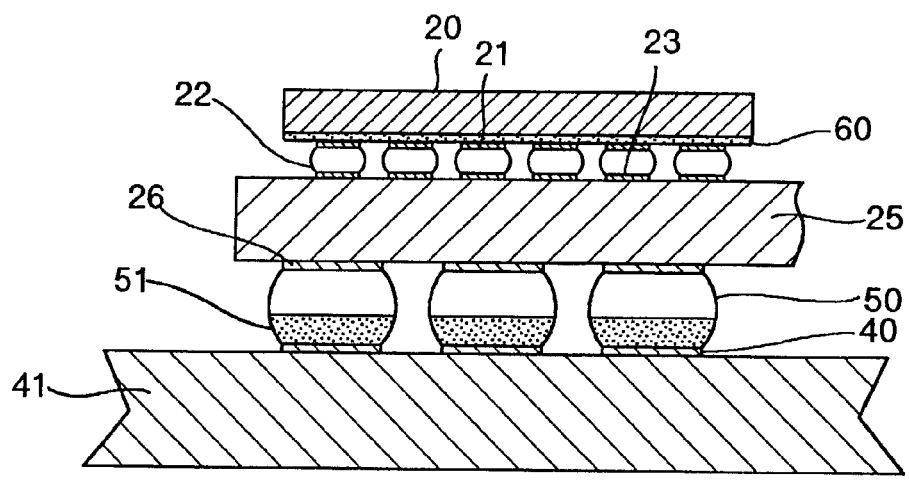
FIG. 14 is a drawing showing MCM in which WPP having the stress relaxation layer is mounted.

By the way, the WPP is a package having a silicon chip 20 provided with routing and bumps 22 each formed on each of chip-shaped pads 21. Thus, mounting on a printed board the WPP as it is causes such a fear as the bumps 22 are peeled off due to stress occurring because of the difference of physical properties (particularly thermal expansion) between the silicon chip 20 and the intermediate substrate 25 which is the printed board. Thus, the underfill 24 is formed between the chip 20 and the intermediate substrate 25 to thereby reinforce the bumps. Means other than the underfill is to provide a stress relaxation layer 60 of a resin material between the chip and the bumps as shown in FIGS. 13 and 14. In this case, no underfill is required. Incidentally, FIG. 13 corresponds to the structure of FIG. 10, and FIG. 14 corresponds to the structure of FIG. 12.

Figure 15:
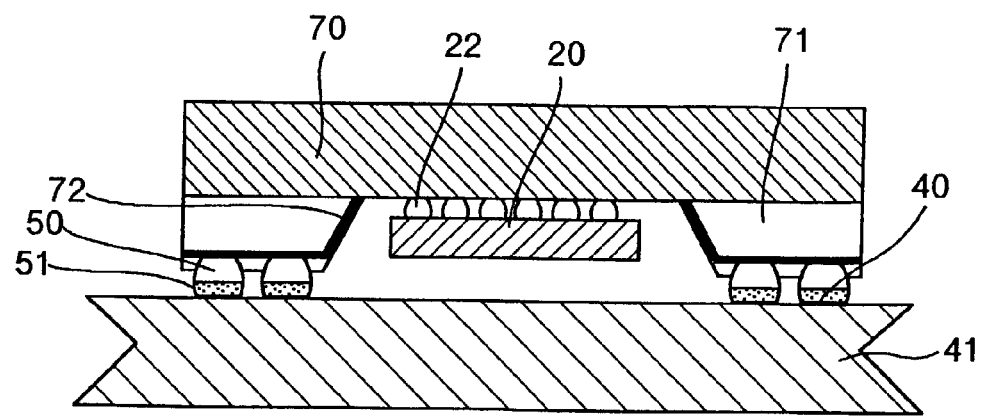
FIG. 15 is a drawing showing a case where a semiconductor device having a silicon substrate 70 is mounted on another substrate.

Next, there is shown in FIG. 15 an example in which a semiconductor device using glass or silicon substrate 70 is mounted on a substrate 41. On the substrate 70 are provided wiring 72 located around the substrate and stress relaxation layer 71 formed along the periphery thereof, and bumps 50, 51 are formed on the stress relaxation layer 71. On the other hand, in the vicinity of the center of the lower side of the silicon substrate 70 is mounted a silicon chip 20 of WPP through the bumps 22 toward a mounting substrate 41. Solders 22 and 50 used at the lower side of the WPP and the stress relaxation layer 71 are made of a composition containing no Ag or a small amount of Ag such as Sn-0.75Cu and Sn-1Ag-0.5Cu, and a solder for mounting on the substrate 41 is usually used Sn—Ag—Cu solder such as, for example, Sn-3Ag-0.5Cu. Thus, in the structure of the bumps formed after the mounting, a mixture layer 51 is present which contain the composition of the solder for mounting. Regarding the silicon substrate 70, there is no difference in physical properties between the silicon substrate 70 and the chip 20. Thus, it is unnecessary to provide any underfill at the bonding portion formed by the bumps between the chip 20 of WPP and the silicon substrate 70.

Thus, in the multi-chip module structure, it becomes possible to prevent the whiskers from occurring by using, regarding the semiconductor device such as WPP or BGA, bumps made of Pb-free solder containing no or a small amount of Ag such as, for example, Sn-0 to about 2.0 mass % Ag— from about 0.3 to about 0.8 mass % Cu solder, and by using, when mounting this semiconductor device on the intermediate substrate, Sn— from about 2.5 to about 3.5 mass % Ag— from about 0.3 to about 0.8 mass % Cu solder which has a melting point lower than that of the former solder, and this structure makes it possible to perform the mounting of the multi-chip module having bumps arranged at a narrow pitch not more than 0.3 mm. Of course, this is also applicable to the relation between the bumps provided in the multi-chip module and the solder for mounting which is provided on the mounting substrate. As regards the solder for mounting, any one other than the Sn— from about 2.5 to about 3.5 mass % Ag— from about 0.3 to about 0.8 mass % Cu solder may be used, provided that the melting point of the solder bumps is higher than that of the solder for mounting. In this case, solder containing, for example, Bi or Sn—Zn solder may be used.

According to the invention, it becomes possible to realize the soldering of high reliability in which the heat resisting properties of the circuit substrate and the electronic parts are taken into consideration.

What is claimed is:

1. A semiconductor device having solder bumps each adapted to be connected to a Pb-free solder paste provided on each of pads of a substrate on which the semiconductor device is to be mounted,
   the Pb-free solder paste consisting, by mass, of from about 2.0% to about 3.5% silver, about 0.3% to about 0.8% copper, and the balance of tin,
   each of the solder bumps being Sn—Ag—Cu alloy Pb-free solder and having a solder composition of the same kind as that of the Pb-free solder paste,
   wherein a content of silver contained in the solder bumps is lower than that of silver contained in the Pb-free paste, and wherein a melting temperature of the solder bumps is higher than a melting temperature of the Pb-free solder paste.

2. The semiconductor device according to claim 1, wherein the Pb-free solder forming the solder bumps consists, by mass, of up about 2.0% silver, about 0.3 to about 0.8% copper, and the balance tin.

3. The semiconductor device according to claim 1, wherein each of said solder bumps is made of a Sn, 1 mass % Ag, and 0.5 mass % Cu alloy.

4. The semiconductor device according to claim 1, wherein said semiconductor device is made to be subjected to a reflow heating under a nitrogen gas atmosphere.

5. The semiconductor device according to claim 1, wherein said semiconductor device is provided with a stress-relaxation layer.

6. The semiconductor device according to claim 1, wherein the Pb-free solder of the solder bumps forms a mixture layer with the Pb-free solder paste between the solder paste and each of the solder bumps by diffusion when each of the solder bumps is subjected to reflow heating at a temperature lower than the melting temperature of said solder bumps but higher than the melting temperature of said Pb-free solder paste so that the remainder of each of the solder bumps remaining without completely melting is surrounded by both of said mixture layer and said Pb-free solder paste even on the side portion of the periphery of the solder bumps.

7. The semiconductor device according to claim 6, wherein said mixture layer contains Ag not more than 3 mass %.

* * * * *